United States Patent [19]

Czeschka

[11] Patent Number: 4,550,962

[45] Date of Patent: Nov. 5, 1985

[54] SOLDERLESS ELECTRICAL CONNECTOR ASSEMBLY

[75] Inventor: Franz Czeschka, Rechberghausen, Fed. Rep. of Germany

[73] Assignee: ERNI Elektroapparate GmbH, Adelberg, Fed. Rep. of Germany

[21] Appl. No.: 610,382

[22] Filed: May 15, 1984

[30] Foreign Application Priority Data

May 18, 1983 [DE] Fed. Rep. of Germany ....... 3318135

[51] Int. Cl.[4] ........................ H05K 13/04; H01R 9/09

[52] U.S. Cl. .................................. 339/17 LC; 29/739

[58] Field of Search ........... 339/17 C, 17 LC, 176 M, 339/176 MP, 221 M; 29/739, 741, 745, 747, 845

[56] References Cited

U.S. PATENT DOCUMENTS

| | | | |
|---|---|---|---|
| 3,409,862 | 11/1968 | Lynch et al. | 339/17 LC |
| 3,769,679 | 11/1973 | Kendall | 29/739 |
| 4,045,868 | 9/1977 | Ammon et al. | 29/845 |
| 4,125,935 | 11/1978 | Ammon | 29/739 |
| 4,184,730 | 1/1980 | Huebner | 339/17 LC |

FOREIGN PATENT DOCUMENTS

| | | |
|---|---|---|
| 8207123 | 8/1982 | Fed. Rep. of Germany . |
| 3133155 | 3/1983 | Fed. Rep. of Germany . |

OTHER PUBLICATIONS

European Patent Specification 0 042 692, Date of Publication of Patent Specification Jul. 11, 1984.

*Primary Examiner*—Neil Abrams

*Attorney, Agent, or Firm*—Toren, McGeady, Stanger, Goldberg and Kiel

[57] ABSTRACT

A solderless electrical connector for producing a solderless connection between a multiple contact plug equipped with contact pins and a printed circuit board is provided with inserting segments at the free end of the contact pins which inserting segments are inserted by means of an additional insulating member into through-contacted bore holes of the printed circuit board. A tool having guide ducts formed to receive portions of the contact pins can also be used to press the contact pins into circuit board holes.

1 Claim, 5 Drawing Figures

SOLDERLESS ELECTRICAL CONNECTOR ASSEMBLY

The present invention is directed particularly to electrical connecting devices and more specifically to a solderless connector for providing a solderless connection between a multiple contact plug having contact pins and a printed circuit board having for example electrical or electronic structural component parts mounted thereon particularly for use in industrial, preferably microelectronic, connection technology.

Solderless electrical connectors are generally no longer new or novel in the technical field to which the present invention relates and they have been known for some time in various structural forms and variations. In the prior art there are known, for example, such solderless connections from DE-PS No. 28 22 245 and U.S. Pat. No. 4,045,868 wherein there are disclosed so-called press in pin connections for contact between printed circuit boards and primarily in female multiple contact connectors for so-called back panel or rear wall wiring.

The present invention is directed toward improving and utilizing the advantages and technical advancements of these known connectors, which up to the present time have always been employed for female multiple connectors and in connection with back panel wiring. The present invention is directed toward making this type of industrial connection technology useful in printed circuit technology also, the primary aim of the invention being the receiving and wiring of electronic structural component elements.

SUMMARY OF THE INVENTION

Briefly, the present invention may be defined as a solderless connector assembly for a multiple plug device having contact pins and a printed circuit board particularly useful in microelectronic connector assemblies comprising an insulating housing having a plurality of contact pins mounted therein and arranged in at least one parallel row, the contact pins being formed with connector posts and perpendicularly extending base portions, the connector posts being formed with stop members having stop shoulders thereon. An additional housing having a comb-like configuration shaped with a plurality of parallel teeth defining slots therebetween is provided with the slots having base portions adapted to engage against the base portions of said contact pins and with the parallel teeth being shaped with ends thereof defining complementary shoulders adapted to engage against stop shoulders of stop members formed on said connection posts of said contact pins in order to facilitate insertion of said contact pins in connecting openings of a printed circuit board. The base portions of the additional housing are formed to engage against the base portions of the connecting pins when the connecting posts extend to within the slots formed between the parallel teeth of the additional housing so that the complementary stop shoulders of the parallel teeth may engage against the stop shoulders of the connection posts to effect a pressing connection of the contact pins into the printed circuit board.

In accordance with a further feature of the invention, a separate inserting tool which is removable after a completed inserting process may be provided to produce the pressing connection.

Several advantages may be derived as a result of the present invention which are achievable for the first time with multiple connector plugs involve the elimination of soldering connections which are easily disturbed and which are labor intensive and, therefore, expensive and the prevention of thermal stresses of all the structural component parts resulting from the soldering process as well as the prevention of imponderables related to the contacts which must be formed.

The various features of novelty which characterize the invention are pointed out with particularity in the claims annexed to and forming a part of this disclosure. For a better understanding of the invention, its operating advantages and specific objects attained by its use, reference should be had to the accompanying drawings and descriptive matter in which there are illustrated and described preferred embodiments of the invention.

DETAILED DESCRIPTION OF THE PREFERRED EMBODIMENTS

Figure 1:
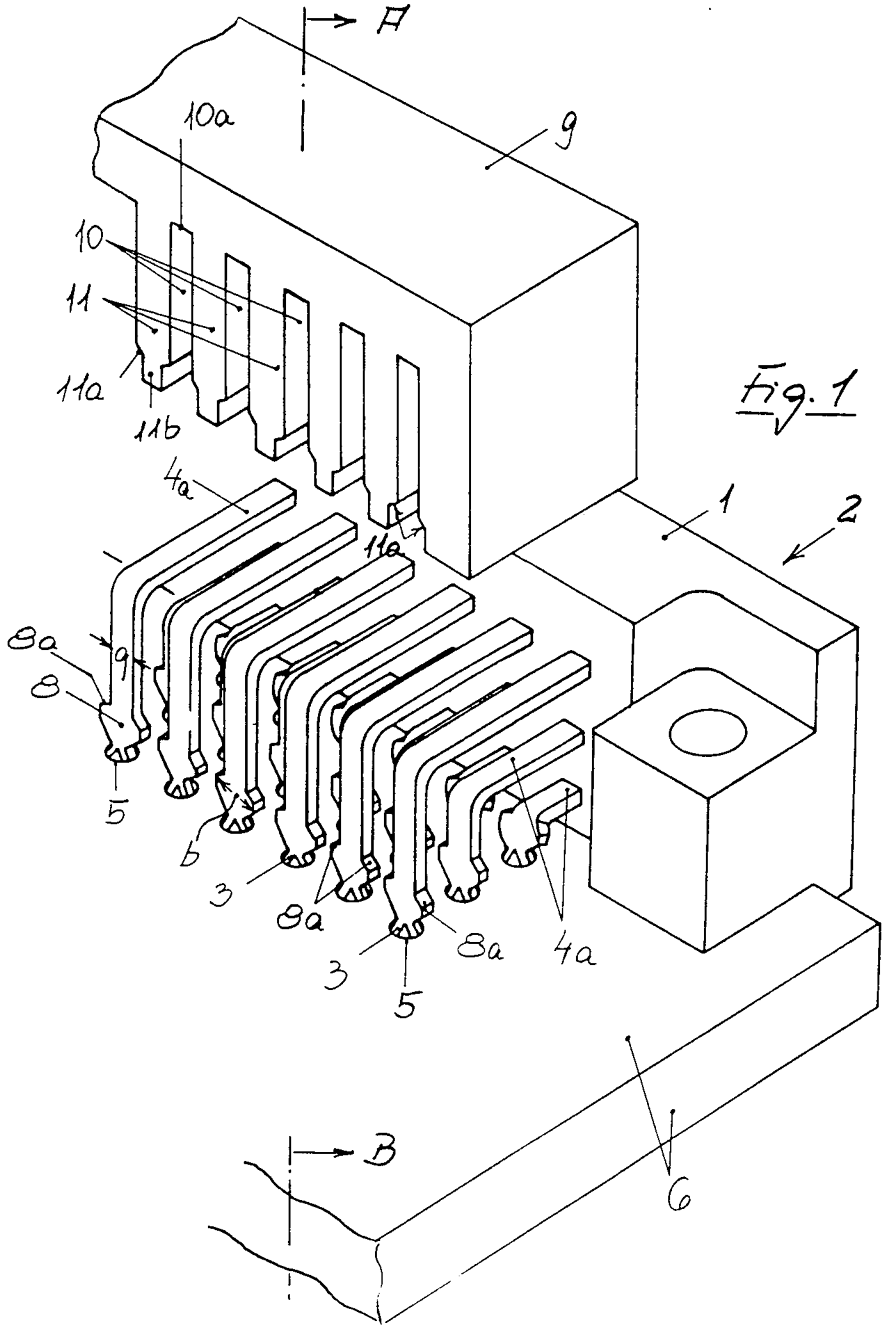
FIG. 1 is a perspective view showing an insertion connector assembly in accordance with the invention.
Figure 2A:
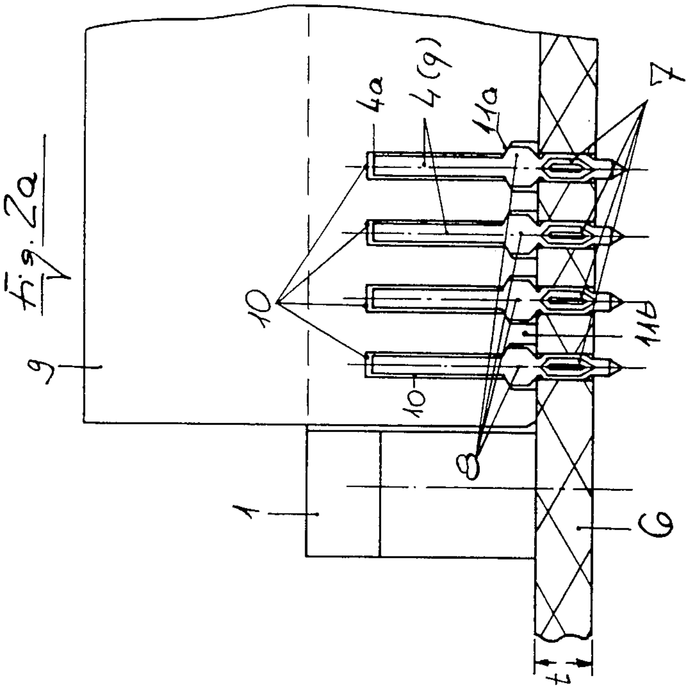
FIG. 2*a* is a view of FIG. 2 taken in the direction of the arrow X.
Figure 2:
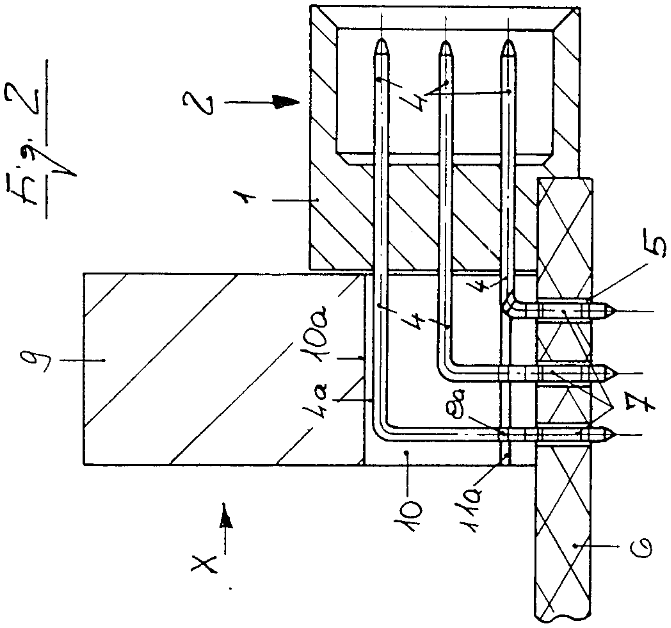
FIG. 2 is a sectional view of the device of FIG. 1 taken along the line A-B of FIG. 1.

Referring now to FIGS. 1, 2 and 2*a*, there is shown in accordance with the present invention a solderless connector assembly which comprises an insulating housing 1 including a multiple contact plug 2. The multiple contact plug 2 has mounted thereon in parallel rows a plurality of contact pins 4 each of which include a connection post 7 having connection ends 3 and a base portion 4*a* extending perpendicularly to the connection posts.

The multiple contact plug 2 is adapted be electrically connected with a printed circuit board 6 which has bore holes 5 therein.

Each of the connection posts of the contact pins 4 is formed with the connection ends 3 and with stop members 8 adjacent the connection ends 3, the stop members 8 being formed to define stop shoulders 8*a*.

The connection posts 7 of the contact posts 4 project freely from the insulating housing 1 of the multiple contact plug 2 and the connection posts 7 are shaped so as to be suited for insertion through the bore holes 5 of the printed circuit board 6. As will be seen in FIG. 2, in order to define or limit the inserting depth t, the respective connection posts 7 are provided with the stop members 8 having the stop shoulders 8*a*, the stop members 8 having a width or dimension b which is enlarged taken relative to the width or dimension q of the connection posts 7.

The connector assembly of the invention is additionally provided with an additional plastic housing 9, the housing 9 serving simultaneously as an insertion tool and as an insulating cover. The housing 9 is formed of plastic material and is provided with a comb-like configuration. A plurality of parallel webs or teeth 11 extend from the housing 9 so as to define therebetween slots or cutout portions 10. The cutout portions 10 are formed with base portions 10*a* and the teeth or webs 11 are formed with free ends 11*b* which define complementary shoulders 11*a* adapted to engage against the stop shoulders 8*a* of the stop members 8.

When it is desired to insert the contact pins 4 into the printed circuit board 6, the housing 9 is arranged so as to have the contact pins 4 extend to within the slots 10. The base portions 4*a* of the pins 4 will be located beneath the base portions 10*a* of the slots 10 and the complementary shoulders 11*a* of the webs or teeth 11 will engage against the stop shoulders 8*a* of the stop members 8.

Thus, with the construction in accordance with the invention there will result, first of all, a favorable transfer of a pressing force during the insertion process from the attachment housing 9 through the shoulders 8*a* to the connection posts 7 and, secondly, it will be ensured that a satisfactory reciprocal electrical insulation is provided by means of the housing parts 11, 11*a*, 11*b* which, in the final state, are located between two adjacent stops or shoulders of the stop members 8, respectively, in each instance.

Figure 3:
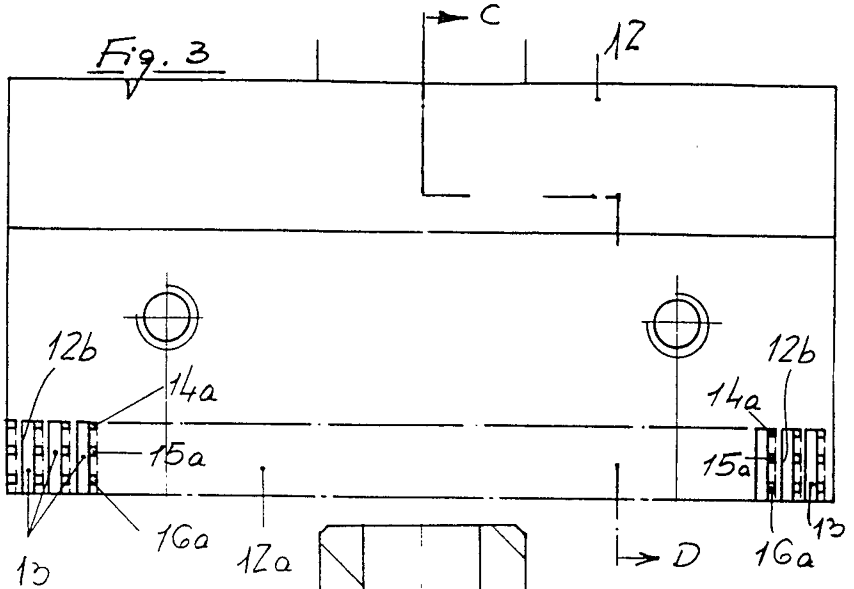
FIG. 3 is a front view of a separate inserting tool.
Figure 4:
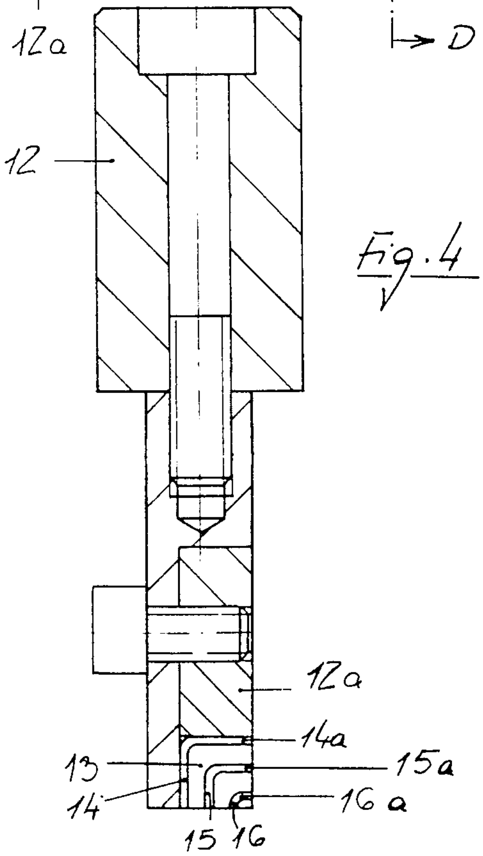
FIG. 4 is a sectional view of FIG. 3 taken along the line C-D of FIG. 3.

Alternatively to the above-described inserting connection there can also be provided in accordance with the invention a separate inserting tool 12 which is depicted in FIGS. 3 and 4. The inserting tool 12 can be removed again after the completion of the inserting process and it will serve to produce the above-described inserting connection wherein the inserting tool is formed with a base or ground area 12*a* of the inserting tool 12 which is provided with parallel pockets or insertion slots 13 corresponding to the provision of posts and with bent guide ducts 14, 15, 16 which are located laterally of the pockets or inserting slots 13. The guide ducts 14, 15, 16 are accessible from the pockets or slots 13. The force necessary for the insertion process is transmitted to the contacts in this embodiment in that the bent guide ducts 14, 15, 16 enclose the respective insertion posts of the contact pins 4 during the inserting process and are supported in each instance on the upper sides or base portions 4*a* of the contact pins with horizontally extending areas 14*a*, 15*a*, and 16*a*.

The placement and removal of the auxiliary tool 12 is made possible first in that the guide ducts 14, 15, 16 open towards one side 12*b* of the slots 13. The auxiliary tool 12 with the pockets or slots 13 is moved to slide over the rows of posts in the direction of the plug member and, after the posts are inserted into the open sides of the slots, is in addition laterally moved or offset by a distance corresponding to the width of the post whereby the bent posts enter into the guide ducts 14, 15, 16.

The advantage of this alternative solution consists in that the inserting posts no longer need to be provided with a shoulder-like stop member 8 and the additional insulating housing 9 can accordingly be dispensed with. After a complete inserting process, the auxiliary tool described above is removed in a manner which will be evident by means of moving it in the opposite direction as that of its placement.

While specific embodiments of the invention have been shown and described in detail to illustrate the application of the inventive principles, it will be understood that the invention may be embodied otherwise without departing from such principles.

What is claimed is:

1. A solderless connector assembly for a multiple plug device having contact pins and a printed circuit board particularly useful in microelectronic connector assemblies comprising:

an insulating housing having a plurality of contact pins mounted therein, said contact pins being arranged in at least one parallel row;

connection posts on each of said contact pins having connection ends adapted to be, by movement in an inserting direction, inserted into printed circuit board holes and projecting freely from said housing;

a base portion on each of said contact pins extending perpendicularly to said connection posts;

an insertion tool adapted to engage said contact pins for inserting said contact pins into a printed circuit board and capable of being removed from engagement with said contact pins after completion of said insertion process;

said insertion tool comprising a base area having parallel pockets consisting of inserting slots on one side thereof adapted to enable said contact pins to be introduced into said parallel pockets by movement of said insertion tool in said inserting direction, and a plurality of guide ducts included in one of the sides of each of said parallel pockets opposite said one side, said guide ducts being accessible from said inserting slots and being shaped to receive therein contact pins located within each of said inserting slots upon movement of said insertion tool laterally of said inserting direction;

said guide ducts being configured to receive therein respective ones of said connection posts of said contact pins during an insertion process and to include portions arranged to be placed in abutment with said base portions of said contact pins in order to apply against said base portions a force inserting said connection ends into said printed circuit board holes when said insertion tool is moved in said inserting direction of said pins, said tool being adapted to be disengaged from said contact pins by lateral movement thereof in a direction opposite to the lateral direction of movement when receiving said contact pins in said guide ducts to bring said contact pins out of said guide ducts and back into said inserting slots.

* * * * *